US009455394B2

(12) United States Patent
Inoue

(10) Patent No.: US 9,455,394 B2
(45) Date of Patent: Sep. 27, 2016

(54) DISPLACEMENT MEMBER, DRIVING MEMBER, ACTUATOR, AND DRIVING DEVICE

(71) Applicant: MURATA MANUFACTURING CO., LTD., Nagaokakyo-Shi, Kyoto-fu (JP)

(72) Inventor: Jiro Inoue, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 615 days.

(21) Appl. No.: 13/948,510

(22) Filed: Jul. 23, 2013

(65) Prior Publication Data

US 2013/0307373 A1    Nov. 21, 2013

Related U.S. Application Data

(63) Continuation of application No. PCT/JP2012/052238, filed on Feb. 1, 2012.

(30) Foreign Application Priority Data

Feb. 7, 2011    (JP) .................................. 2011-023786

(51) Int. Cl.
    *H01L 41/04*    (2006.01)
    *H02N 2/02*    (2006.01)
    *H02N 2/00*    (2006.01)

(52) U.S. Cl.
    CPC .......... *H01L 41/042* (2013.01); *H02N 2/001* (2013.01); *H02N 2/025* (2013.01)

(58) Field of Classification Search
    USPC ........................................................ 310/328
    See application file for complete search history.

(56) References Cited

U.S. PATENT DOCUMENTS

| 4,845,688 A | * | 7/1989 | Butler .................... G10K 9/121 367/163 |
| 5,276,657 A | | 1/1994 | Newnham et al. |
| 5,729,077 A | * | 3/1998 | Newnham .............. H02N 2/043 310/328 |
| 6,175,182 B1 | | 1/2001 | Cross et al. |
| 6,528,926 B2 | | 3/2003 | Okamoto et al. |
| 6,717,333 B2 | * | 4/2004 | Hermle ................. B64C 27/615 310/328 |
| 6,927,528 B2 | * | 8/2005 | Barillot ................ H02N 2/0095 310/325 |

(Continued)

FOREIGN PATENT DOCUMENTS

| CN | 101071998 A | 11/2007 |
| EP | 1070844 A1 | 1/2001 |

(Continued)

OTHER PUBLICATIONS

International Search Report and Written Opinion for PCT/JP2012/052238, date of mailing Feb. 28, 2012.

*Primary Examiner* — J. San Martin
(74) *Attorney, Agent, or Firm* — Arent Fox LLP

(57) ABSTRACT

A displacement member with a driving element that includes first and second side surfaces that extend in a first direction and top and bottom surfaces that extend in a second direction perpendicular to the first direction. The driving element is a piezoelectric element that expands and contracts in the second direction when a pulsed voltage is applied. Further, an elastic conversion element is provided that contains the driving element and includes a first portion that is disposed adjacent the top surface of the driving element and that includes a displacement portion that is displaced downwardly and upwardly in the first direction when the driving element expands and contracts in the second direction, respectively.

19 Claims, 8 Drawing Sheets

(56) References Cited

U.S. PATENT DOCUMENTS

| | | | |
|---|---|---|---|
| 7,498,718 B2 | 3/2009 | Vogeley | |
| 8,159,114 B2* | 4/2012 | Rahman | E21B 23/00 310/328 |
| 8,283,838 B2* | 10/2012 | Yun | H02N 2/025 310/323.02 |
| 8,864,645 B2* | 10/2014 | Abel | H04R 25/606 600/25 |
| 2006/0146096 A1* | 7/2006 | Wright | F04B 9/105 347/68 |
| 2006/0261706 A1 | 11/2006 | Yoon et al. | |
| 2007/0206441 A1* | 9/2007 | Porzio | G10K 9/121 367/163 |

FOREIGN PATENT DOCUMENTS

| | | |
|---|---|---|
| JP | 03-273871 | 12/1991 |
| JP | 4-69070 A | 3/1992 |
| JP | 07-129244 A | 5/1995 |
| JP | 2633066 B2 | 7/1997 |
| JP | 2004-069070 A | 3/2004 |
| JP | 2007-516688 A | 6/2007 |
| JP | 04-154851 B2 | 9/2008 |
| JP | 2009-254154 A | 10/2009 |
| JP | 2010-263687 A | 11/2010 |
| KR | 2006-0118927 A | 11/2006 |
| KR | 20070101508 A | 10/2007 |

* cited by examiner

PRIOR ART

DISPLACEMENT MEMBER, DRIVING MEMBER, ACTUATOR, AND DRIVING DEVICE

CROSS REFERENCE TO RELATED APPLICATIONS

The present application is a continuation of PCT/JP2012/052238 filed Feb. 1, 2012, which claims priority to Japanese Patent Application No. 2011-023786, filed Feb. 7, 2011, the entire contents of each of which are incorporated herein by reference

FIELD OF THE INVENTION

The present invention relates to a displacement member, a driving member, an actuator, and a driving device. In particular, the present invention relates to a displacement member utilizing a driving element, a driving member equipped therewith, and an actuator equipped therewith, and a driving device equipped therewith.

BACKGROUND OF THE INVENTION

In the past, as a small-sized actuator, an actuator has been known that utilizes a piezoelectric element. An example of this actuator utilizing the piezoelectric element has been described in the following Patent Document 1 or 2.

In Patent Document 1, an actuator has been described that includes an electromechanical conversion element in which an end portion on one side thereof in a length direction is fixed to a pedestal, a driving frictional member connected to an end portion on the other side of the electromechanical conversion element in the length direction, and an engaging member engaging with the driving frictional member. In this actuator, the electromechanical conversion element expands and contracts in the length direction, and hence, the driving frictional member vibrates in a length direction. Owing to a frictional force between the driving frictional member and the engaging member, the frictional force occurring at this time, the engaging member moves in the length direction relative to the driving frictional member. In other words, in the actuator described in Patent Document 1, the expansion and contraction direction of the electromechanical conversion element and a direction in which a driving force occurs are parallel to each other, and the direction of the driving force and the direction of a vibrational displacement are parallel to each other.

On the other hand, in Patent Document 2, an actuator 100 has been described that converts the direction of a driving force illustrated in FIG. 14. The actuator 100 includes a plate-like shaft fixing member 102, a pair of vibrating plates 103a and 103b, a substrate 104, and a shaft 101. One end of the shaft 101 is connected to the shaft fixing member 102. The pair of vibrating plates 103a and 103b supports both end portions of the shaft fixing member 102, and extends in a direction perpendicular to the shaft fixing member 102. In the substrate 104, the end portions of the vibrating plates 103a and 103b, located on the side opposite to the shaft fixing member 102, are fixed. Piezoelectric elements 105a and 105b are fixed to the vibrating plates 103a and 103b. In association with the expansion and contraction deformation of the piezoelectric elements 105a and 105b, the vibrating plates 103a and 103b extending in the direction perpendicular to the shaft fixing member 102 are subjected to flexion deformation. As a result, the directions of driving forces occurring from the piezoelectric elements 105a and 105b are converted, and the shaft fixing member 102 is vibrationally displaced. Owing to this, the shaft 101 vibrates, and the engaging member 106 is driven.

Patent Document 1: Japanese Patent No. 4154851
Patent Document 2: Japanese Unexamined Patent Application Publication No. 2009-254154

In an electromechanical conversion element expanding and contracting in parallel to the direction of a driving force in such a way as described in the above-mentioned Patent Document 1, in order to obtain the sufficient displacement amount of vibration, it is necessary to lengthen the electromechanical conversion element in the direction of the vibration. Therefore, in such an electromechanical conversion element as described in Patent Document 1, there occurs a problem that it is difficult to perform miniaturizing in the direction of a vibrational displacement.

Also in the actuator 100 described in Patent Document 2, which converts the direction of the driving force, in order to obtain a large displacement amount, a method is adopted where the vibrating plates 103a and 103b are lengthened in parallel to the direction of the vibrational displacement so as to increase a flexion deformation amount. Therefore, in the actuator 100 described in Patent Document 2, there occurs a problem that it is difficult to perform miniaturizing in the direction of the vibrational displacement where the directions of the driving forces occurring from the piezoelectric elements 105a and 105b are converted.

SUMMARY OF THE INVENTION

The present invention is made in view of such a point, and an object thereof is to achieve the miniaturization of a displacement member.

A displacement member according to the present invention includes a driving element and a conversion element. The driving element includes first and second end surfaces facing each other in a first direction and first and second side surfaces facing each other in a second direction perpendicular to the first direction. The driving element expands and contracts in the first direction. The conversion element includes a displacement portion that converts an expansion and contraction force of the driving element in the first direction into a driving force in the second direction and is displaced in the second direction owing to the corresponding driving force. The conversion element has elasticity. The conversion element includes first to fifth portions. The first portion is located above the first side surface. The first portion includes a convex portion including the displacement portion spaced from the first side surface. The second portion is connected to the first portion. The second portion comes into contact with the first end surface. The third portion is connected to the first portion. The third portion comes into contact with the second end surface. The fourth portion is connected to the second portion. The fourth portion is fixed to the second side surface. The fifth portion is connected to the third portion. The fifth portion is fixed to the second side surface.

In addition, in the present invention, "coming into contact" includes not only a case of directly coming into contact but also a case of indirectly coming into contact. In other words, the "coming into contact" means that no air gap exists between members.

In a specific aspect of the displacement member according to the present invention, the fourth portion and the fifth portion are directly fixed to each other, and substantially the whole second side surface is fixed to the fourth and fifth portions.

In addition, in the present invention, "substantially the whole" means 90% or more of the total.

In another specific aspect of the displacement member according to the present invention, the fourth portion and the fifth portion are integrally formed.

In yet another specific aspect of the displacement member according to the present invention, the displacement member further includes a resin adhesive layer configured to fix the fourth and fifth portions and the second side surface to each other.

In yet another specific aspect of the displacement member according to the present invention, the second portion is fixed to the first end surface, and the third portion is fixed to the second end surface.

In yet another specific aspect of the displacement member according to the present invention, substantially the whole first portion is configured to be a convex portion.

In yet another specific aspect of the displacement member according to the present invention, the conversion element further includes a sixth portion configured to connect the second portion and the fourth portion to each other and be located above an end edge portion on a first end surface side of the second side surface, and a seventh portion configured to connect the third portion and the fifth portion to each other and be located above an end edge portion on a second end surface side of the second side surface. Each of the sixth and seventh portions is provided so as to be spaced from the second side surface.

In yet another specific aspect of the displacement member according to the present invention, the driving element is fitted into the conversion element.

In yet another specific aspect of the displacement member according to the present invention, the conversion element includes a metal.

A driving member according to the present invention includes the above-mentioned displacement member according to the present invention, and a displaced member configured to be attached to the displacement member.

In a specific aspect of the driving member according to the present invention, the displaced member is attached to at least one of the first portion and at least one of the fourth and fifth portions.

In another specific aspect of the driving member according to the present invention, the displaced member is attached to the displacement portion.

An actuator according to the present invention includes the above-mentioned driving member according to the present invention and a driven member. The displaced member is a shaft. The driven member is provided in contact with the shaft, and provided so as to move in the second direction owing to a frictional force occurring with the shaft when the shaft is displaced in the second direction.

A driving device according to the present invention includes the above-mentioned actuator according to the present invention, and a control unit configured to control the actuator.

According to the present invention, it may be possible to achieve the miniaturization of a displacement member.

DETAILED DESCRIPTION OF THE PREFERRED EMBODIMENTS OF THE INVENTION

Hereinafter, examples of preferred embodiments of the present invention will be described. In this regard, however, the following embodiments are just exemplified. The present invention is not limited to the following embodiments.

(First Embodiment)

Figure 1:
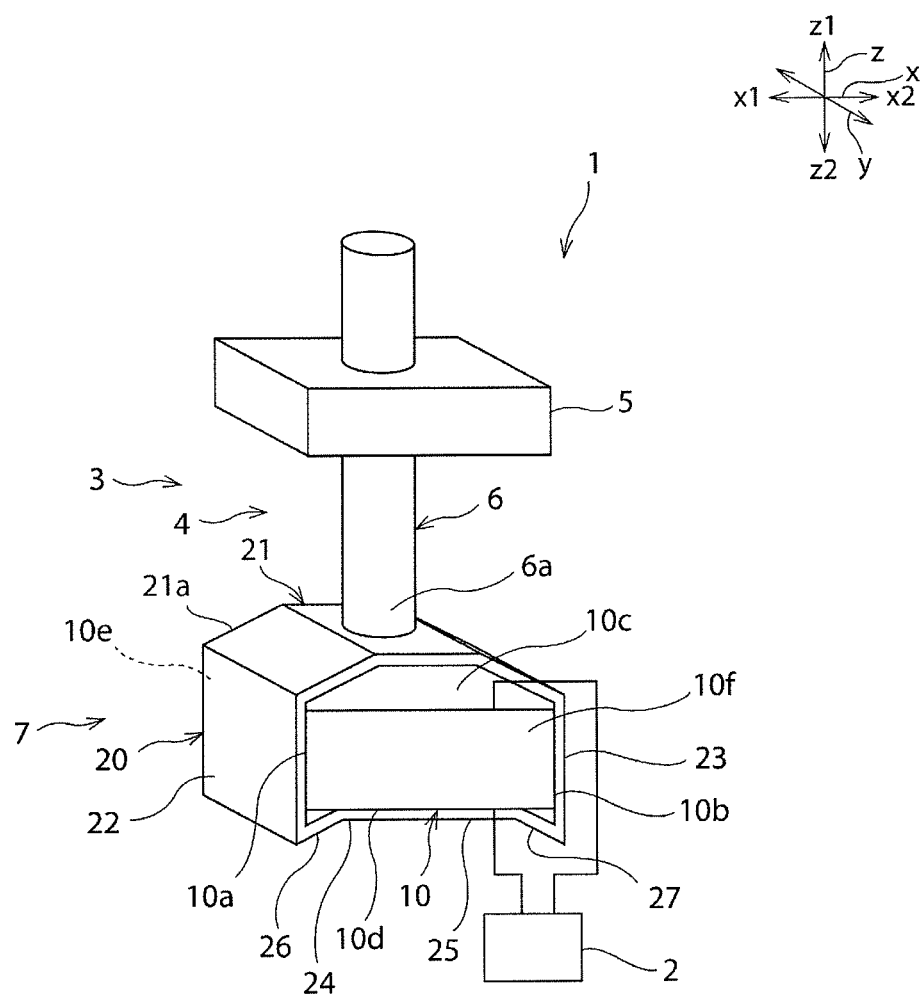
FIG. 1 is a schematic perspective view of a driving device according to a first embodiment.
Figure 2:
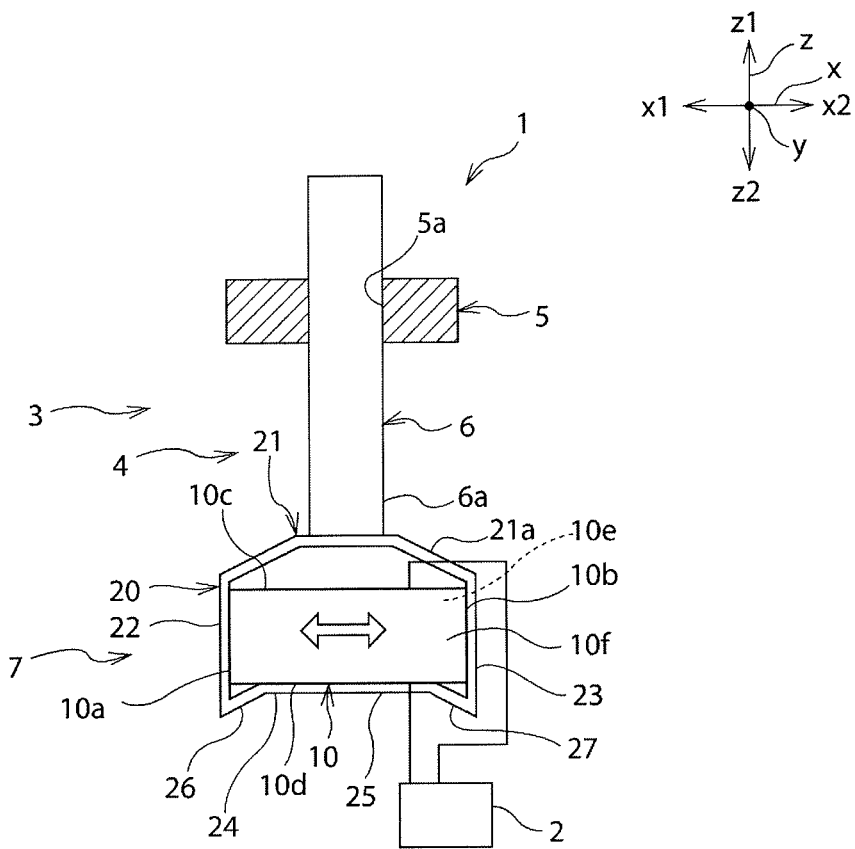
FIG. 2 is a schematic side view of a driving device according to the first embodiment.

FIG. 1 is a schematic perspective view of a driving device according to a first embodiment. FIG. 2 is a schematic side view of the driving device according to the first embodiment.

As illustrated in FIG. 1 and FIG. 2, a driving device 1 includes a control unit 2 and an actuator 3. The control unit 2 is a portion controlling the actuator 3. Specifically, the control unit 2 controls a voltage to be applied to a piezoelectric element 10 serving as a driving element for the after-mentioned actuator 3. It is desirable that the piezoelectric element 10 is a laminated piezoelectric ceramic element including electrodes laminated therewithin through piezoelectric ceramics. The reason is that it is possible to reduce a voltage to be applied to the piezoelectric element 10, and obtain a large displacement amount. In addition, since the piezoelectric ceramics has relatively high rigidity, and it is possible to reduce attenuation in the vibration of a high frequency, the piezoelectric ceramics has an advantageous effect that it is possible to increase the resonant frequency of a displacement member, using a driving element utilizing the piezoelectric ceramics. In addition, in the present invention, the driving element is not limited to the piezoelectric element. In the present invention, the driving element may also be an electrostrictive element, a magnetostrictive element, a thermal deformation element, or a linear motor utilizing an electromagnetic force or an electrostatic force.

The actuator 3 includes a driving member 4 and a driven member 5. The driving member 4 is a member used for causing the driven member 5 to be driven. Specifically, the driving member 4 is a member used for causing the driven member 5 to move in a z direction. Here, the z direction is the displacement direction of a shaft 6 serving as a displaced member.

In addition, while, in FIG. 1 and FIG. 2, the driven member 5 is drawn in a rectangle plate shape, the driven member is not limited to this. In the present invention, the driven member serving as a drive target object may be any type of member, and, for example, a single lens, a compound lens group, an imaging element, an aperture stop mechanism, an optical mirror, a laser light emitting element, a magnetic head, various kinds of sensor elements, or the like.

The driving member 4 includes the shaft 6 serving as the displaced member extending in the z direction, and a displacement member 7. The shaft 6 is inserted into a through hole 5a formed in the driven member 5. It is desirable that the shaft 6 is formed using, for example, a material such as carbon, whose specific gravity is small. In addition, it is desirable that the driven member 5 and the shaft 6 are members whose mutual friction is small. So as to make an engagement force between the through hole 5a and the shaft 6 appropriate, it is desirable that a pressurization mechanism such as a spring is provided.

An end portion 6a on one side of the shaft 6 in the z direction is attached to the displacement member 7. The displacement member 7 is a member used for causing the shaft 6 to be displaced in the z direction.

The displacement member 7 includes the piezoelectric element 10 and a conversion element 20.

In the present embodiment, a direction in which the piezoelectric element 10 expands and contracts is an x direction perpendicular to the z direction. In addition, the piezoelectric element 10 is formed in a prismatic shape. Here, the "prismatic shape" includes a shape where at least a portion of a corner portion or a ridge line portion is in a chamfered shape or an R-chamfered shape. In addition, that the prismatic shape includes a rectangular parallelepiped shape.

The piezoelectric element 10 includes first and second end surfaces 10a and 10b and first to fourth side surfaces 10c to 10f. Each of the first and second end surfaces 10a and 10b extends in a y direction and the z direction, the y direction being perpendicular to each of the z direction and the x direction. The first and second end surfaces 10a and 10b face each other in the x direction. Each of the first and second side surfaces 10c and 10d extends in the x direction and the y direction. The first and second side surfaces 10c and 10d face each other in the z direction. Each of the third and fourth side surfaces 10e and 10f extends in the x direction and the z direction. The third and fourth side surfaces 10e and 10f face each other in the y direction.

Figure 3:
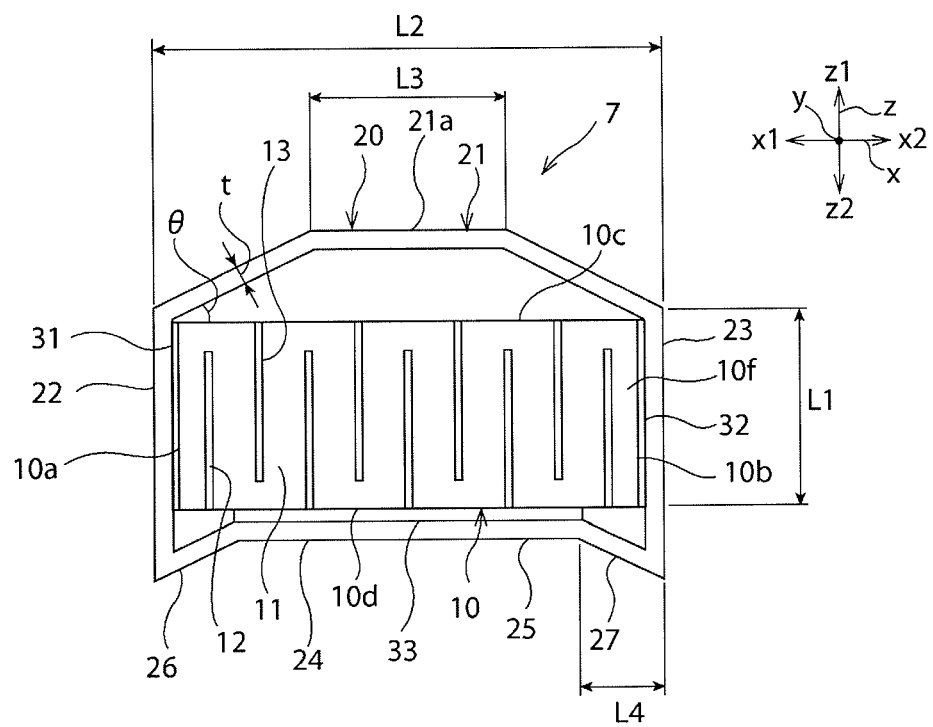
FIG. 3 is a diagrammatic side view of a displacement member in the first embodiment.

FIG. 3 is a diagrammatic side view of a displacement member in the present embodiment. As illustrated in FIG. 3, the piezoelectric element 10 includes a plurality of pairs of first and second electrodes 12 and 13 facing each other through a piezoelectric layer 11 in the x direction. By applying a voltage between these first and second electrodes 12 and 13, it is possible to cause the piezoelectric element 10 to expand and contract in the x direction.

In addition, it is not always necessary for the plural pairs of the first and second electrodes to be provided. Only one pair of first and second electrodes may be provided. In addition, the facing direction of the first and second electrodes is not limited to the x direction serving as an expansion and contraction direction. Depending on the polarization direction of a piezoelectric body, in some cases, the first and second electrodes are provided so as to face each other in the z direction or the y direction.

The materials of the piezoelectric layer 11 and the first and second electrodes 12 and 13 are not specifically limited. Of, for example, an arbitrary piezoelectric body of lead zirconate titanate-based ceramics (PZT), non-lead based piezoelectric ceramics such as alkali niobate-based ceramics such as potassium sodium niobate, or piezoelectric single crystal such as lithium tantalate, it is possible to form the piezoelectric layer 11. Of, for example, a metal such as Ag, Cu, or Pt or an alloy such as an Ag—Pd alloy, it is possible to form the first and second electrodes 12 and 13.

The conversion element 20 includes such an elastic body as typified by a metal such as iron, copper, or nickel, or an alloy such as stainless steel, Fe-42Ni alloy, beryllium copper, phosphor bronze, or brass. This conversion element 20 is an element that converts the direction of a driving force so that the driving force due to the expansion and contraction of the piezoelectric element 10 in the x direction becomes a driving force in the z direction, and which causes the shaft 6 to be displaced in the z direction owing to the driving force whose direction is converted. In addition, it is not always necessary for the driving direction of the piezoelectric element 10 and a direction in which the driving force of the piezoelectric element 10 is converted by the conversion element to be perpendicular to each other. In addition, while, in the present embodiment, the x direction and the z direction are perpendicular to each other, it is not always necessary for the x direction and the z direction to be perpendicular to each other.

The conversion element 20 has a ring shape including first to seventh portions 21 to 27. The above-mentioned piezoelectric element 10 is fitted into the conversion element 20 having this ring shape. In the present embodiment, the first to seventh portions 21 to 27 are integrally formed. In other words, the conversion element 20 has the ring shape. By causing the conversion element 20 to have the ring shape, it becomes easy to increase the resonant frequency of the displacement member 7 including the conversion element 20 and the piezoelectric element 10. Therefore, it becomes easy to obtain the vibration of the displacement member 7 whose frequency is higher, namely, whose driving speed is fast. Furthermore, by causing the piezoelectric element 10 to vibrate in the vicinity of the resonant frequency of the displacement member 7, it is possible to drive with less input energy. In addition, the conversion element 20 may also be configured using a single member, and may also be configured by a plurality of members being joined.

The first portion 21 is located above the first side surface 10c. In other words, the first portion 21 is located on the z1 side of the first side surface 10c in the z direction. The first portion 21 includes a convex portion 21a. In the present embodiment, the whole first portion 21 is configured to be the convex portion 21a. The convex portion 21a is spaced from the first side surface 10c. The convex portion 21a protrudes from the first side surface 10c toward the z1 side in the z direction. The above-mentioned shaft 6 is attached to the top portion of this convex portion 21a. A method for attaching the shaft 6 to the convex portion 21a is not specifically limited. For example, using a resin adhesive, the shaft 6 may also be attached to the convex portion 21a, and may also be integrally formed using the same material as the conversion element 20. In addition, the cross-sectional shape of the shaft 6 may be in an arbitrary shape such as a circular shape, various kinds of polygonal shapes, or various kinds of combinational shapes. It is desirable that the shape and dimension of the cross-sectional surface of the shaft 6 are approximately equal in the z direction.

The second portion 22 has a flat plate shape. The second portion 22 is located on the first end surface 10a. In other words, the second portion 22 is located on the x1 side of the first end surface 10a in the x direction. An end portion on the z2 side of the second portion 22 in the z direction leads to a z2 side compared with the second side surface 10d. The second portion 22 comes into contact with the first end surface 10a. Specifically, in the present embodiment, substantially the whole first end surface 10a comes into contact with the second portion 22. In detail, as illustrated in FIG. 3, the second portion 22 and the first end surface 10a are caused to adhere to each other by a resin adhesive layer 31, and come into contact with each other through the resin adhesive layer 31. In addition, in FIG. 1 and FIG. 2, the drawing of the resin adhesive layer 31 and after-mentioned resin adhesive layers 32 and 33 is omitted.

The third portion 23 has a flat plate shape. The third portion 23 is located on the second end surface 10b. In other words, the third portion 23 is located on the x2 side of the second end surface 10b in the x direction. An end portion on the z2 side of the third portion 23 in the z direction leads to the z2 side compared with the second side surface 10d. The third portion 23 comes into contact with the second end surface 10b. Specifically, in the present embodiment, substantially the whole second end surface 10b comes into contact with the third portion 23. In detail, as illustrated in FIG. 3, the third portion 23 and the second end surface 10b are caused to adhere to each other by the resin adhesive layer 32, and come into contact with each other through the resin adhesive layer 32.

The fourth portion 24 is indirectly connected to the second portion 22. The fourth portion 24 is located on the second side surface 10d. In other words, the fourth portion 24 is located on the z2 side of the second side surface 10d in the z direction.

On the other hand, the fifth portion 25 is indirectly connected to the third portion 23. The fifth portion 25 is located on the second side surface 10d. In other words, the fifth portion 25 is located on the z2 side of the second side surface 10d in the z direction.

In the present embodiment, the fourth and fifth portions 24 and 25 are integrally formed. In addition, the fourth and fifth portions 24 and 25 are caused to adhere to the second side surface 10d by the resin adhesive layer 33, and hence, fixed. In the present embodiment, substantially the whole second side surface 10d is fixed to the fourth and fifth portions 24 and 25 owing to the resin adhesive layer 33.

The second portion 22 and the fourth portion 24 are connected owing to the sixth portion 26. The sixth portion 26 is located above an end edge portion on the first end surface 10a side of the second side surface 10d. In other words, the sixth portion 26 is located above the z2 side of a ridge line portion in the z direction, the ridge line portion being configured owing to the second side surface 10d and the first end surface 10a. The sixth portion 26 is provided so as to be spaced from the second side surface 10d.

The third portion 23 and the fifth portion 25 are connected owing to the seventh portion 27. The seventh portion 27 is located above an end edge portion on the second end surface 10b side of the second side surface 10d. In other words, the seventh portion 27 is located above the z2 side of a ridge line portion in the z direction, the ridge line portion being configured owing to the second side surface 10d and the second end surface 10b. The seventh portion 27 is provided so as to be spaced from the second side surface 10d.

In addition, in the present embodiment, an example has been described where a ridge line portion between the first end surface 10a or the second end surface 10b and the first side surface 10c is in contact with the conversion element 20. In this regard, however, the present invention is not limited to this configuration. The conversion element may also be provided so that the ridge line portion between the first or second end surface and the first side surface is not in contact with the conversion element. In other words, the conversion element may also be provided so that the second and third portions 22 and 23 are not in contact with the ridge line portion between the first end surface 10a or the second end surface 10b and the first side surface 10c.

In addition, in a case where the conversion element 20 is formed so as to have a ring-shaped structure closed of a plate-like member whose width is uniform, it is desirable that the thickness t of the plate-like conversion element 20 when the y-z cross-sectional surface of the piezoelectric element 10 is about 1 mm is about 0.1 mm to 0.25 mm. From the point of view that it is possible to increase the resonant frequency of the displacement member and reduce the attenuation of vibration, it is desirable that the Young's modulus of the conversion element 20 is 100 GPa or more. While the desirable upper limit of the Young's modulus of the conversion element 20 is not specifically limited, if the desirable upper limit is set to, for example, about 300 GPa or less, it is possible to easily form the conversion element 20 by, for example, subjecting a plate-like material to a bending process. From the point of view that it is possible to efficiently convert the driving force of the piezoelectric element 10, it is desirable that the degree 0 of an angle formed by the plane-shaped first portion 21 and the plane-shaped first side surface 10c is about 15 degrees to 45 degrees. It is desirable that the ratio (L2/L1) of the length L2 of the piezoelectric element 10 in the x direction to the length L1 of the piezoelectric element 10 in the z direction is about 0.8 to 2. It is desirable that the ratio (L3/L2) of the length L3 of the top portion of the first portion 21 in the x direction to the length L2 of the piezoelectric element 10 in the x direction is about 0.3 to 0.7. It is desirable that the ratio (L4/L2) of the length L4 of each of the sixth and seventh portions 26 and 27 in the x direction to the length L2 of the piezoelectric element 10 in the x direction is about 0.05 to 0.2. By doing this, the expansion and contraction deformation of the piezoelectric element 10 in the x direction is converted into the displacement of the first portion 21 in the z direction, the shaft 6 is caused to be displaced in the z direction, and it is possible to cause the driven member 5 to move in the z direction.

Next, the operation of the driving device 1 will be described. The control unit 2 applies, for example, a pulsed voltage between the first and second electrodes 12 and 13 in the piezoelectric element 10. Accordingly, the piezoelectric element 10 expands and contracts in the x direction.

Here, in the present embodiment, each of the fourth and fifth portions 24 and 25 is fixed to the second side surface 10d. In addition, the second and third portions 22 and 23 come into contact with the first and second end surfaces 10a and 10b. Therefore, when the piezoelectric element 10 expands in the x direction, at least a portion on the z1 side of the second portion 22 in the z direction is displaced to the x1 side, and at least a portion on the z1 side of the third portion 23 in the z direction is displaced to the x2 side. Therefore, a distance between the portion on the z1 side of the second portion 22 and the portion on the z1 side of the third portion 23 is increased. As a result, the curvature of the convex portion 21a of the first portion 21 connected to the second and third portions 22 and 23 becomes small. Accordingly, the top portion of the convex portion 21a is displaced to the z2 side.

On the other hand, when the piezoelectric element 10 contracts in the x direction, at least the portion on the z1 side of the second portion 22 in the z direction is displaced to the x2 side, and at least the portion on the z1 side of the third portion 23 in the z direction is displaced to the x1 side.

Therefore, a distance between the portion on the z1 side of the second portion 22 and the portion on the z1 side of the third portion 23 is decreased. As a result, the curvature of the convex portion 21a of the first portion 21 connected to the second and third portions 22 and 23 becomes large. Accordingly, the top portion of the convex portion 21a is displaced to the z1 side. In this way, the conversion element 20 converts the expansion and contraction force of the piezoelectric element 10 in the x direction into a driving force in the z direction. In addition, the convex portion 21a of the first portion 21 includes a displacement portion displaced in the z direction owing to the corresponding driving force.

When the piezoelectric element 10 expands in the x direction, a displacement in the x direction becomes zero at the middle point of the dimension of the piezoelectric element 10 in the x direction, contraction occurs in the z direction, and a distance between the first side surface 10c and the second side surface 10d tries to become slightly small. However, since the second side surface 10d is partially fixed to the fourth and fifth portions 24 and 25 in the conversion element 20, and subjected to the constraint of the conversion element 20, a displacement in the z direction also becomes small in the central portion of the second side surface 10d. As a result, compared with the displacement amount of the first portion 21 in the z direction, a displacement amount in the central portion of the second side surface 10d or a central portion in the bottom surface of the conversion element including the fourth and fifth portions 24 and 25 becomes small. Therefore, without taking a measure such as adding a weight to a specific position in the displacement member 7 or providing a strong housing and fixing thereto, it becomes possible to cause the first portion 21 of the conversion element 20 to move in the z direction. For example, by joining the fourth and fifth portions 24 and 25 of the conversion element 20 in the vicinity of a center and extending that portion downward, it is possible to fix to the housing without taking a particular measure.

As described above, in association with the expansion and contraction of the piezoelectric element 10, the top portion of the convex portion 21a vibrates in the z direction. In association with this, the shaft 6 also vibrates in the z direction. In other words, the shaft 6 is repeatedly displaced to the z1 side and displaced to the z2 side. At this time, if the displacement member 7 steeply drives in response to a steep voltage waveform applied from the control unit 2 to the piezoelectric element 10, the displacement of the shaft 6 also becomes rapid. For example, if the displacement speed (a displacement amount per unit time) of the shaft 6 in a z1 direction is higher than a setting, an inertial force acting on the driven member 5 becomes more dominant than a frictional force between the driven member 5, provided so as to be in contact with the shaft 6, and the shaft 6, and the driven member 5 slides on the shaft 6 to relatively move in a z2 direction. Next, if the displacement speed of the shaft 6 in the z2 direction is less than or equal to the setting, the frictional force between the driven member 5 and the shaft 6 becomes more dominant than the inertial force acting on the driven member 5, and a relative position between the driven member 5 and the shaft 6 does not change. By repeating this, the driven member 5 moves in the z2 direction.

Figure 14:
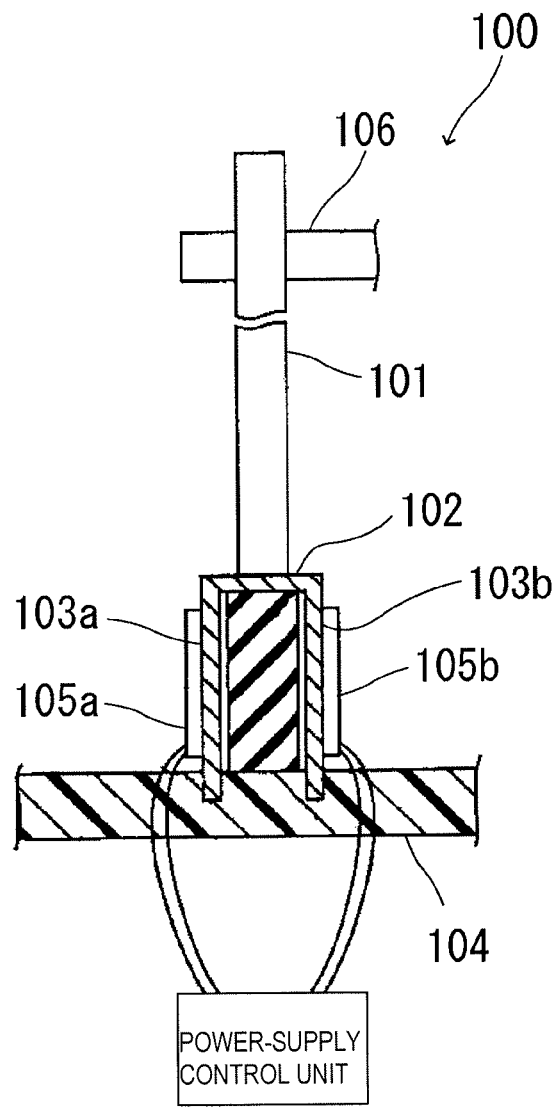
FIG. 14 is a diagrammatic cross-sectional view of a conventional actuator described in Patent Document 2.

As described above, a weight or fixing is not necessary for the displacement member 7 in the present embodiment. Therefore, using the displacement member 7, it is possible to achieve the miniaturization of the actuator 3. In particular, for example, compared with the actuator 100 of the related art illustrated in FIG. 14 where the vibrating plates 103a and 103b and the shaft 101 are disposed in the driving direction of the shaft and the shaft 101 is displaced in the driving direction owing to the flexion deformation of the vibrating plates 103a and 103b, it is possible to miniaturize a dimension in the z direction serving as a direction in which the shaft extends.

Incidentally, so as to achieve the miniaturization of such an actuator as described in Patent Document 1, which includes a weight, it is necessary to miniaturize the weight. On the other hand, so as to increase the displacement amount of the actuator, it is necessary to make the weight heavier. Therefore, so as to miniaturize the actuator while the large displacement amount of the actuator is maintained, it is necessary to use an expensive weight having a high specific gravity. Therefore, the cost of the actuator is increased. In addition, the weight of the actuator is increased. In addition, a position serving as the node of vibration when a composite body including the shaft, the piezoelectric element, and the weight vibrates is located near the weight side of the piezoelectric element or the piezoelectric element side of the weight, and in order to fix the node portion to the housing, it is necessary to attach the composite body using a rubber-like elastic body or the like so as not to interfere with the vibration. Therefore, an assembly operation tends to become difficult.

On the other hand, an expensive weight having a high specific gravity is not necessary for the actuator 3 of the present embodiment. Accordingly, since it is possible to reduce the number of components in the actuator 3, it is possible to reduce a manufacturing cost. In addition, by eliminating the weight, it is possible to reduce the weight of the actuator. Furthermore, for example, it is possible to extend and fix a metal or the like in the central portion of the lower side of the conversion element 20 to the housing, and hence it is easy to perform assembling.

Here, it is easier to control the actuator 3 of the present embodiment than to control the actuator 100 of the related art. In other words, in the actuator 100 of the related art, the shaft fixing member 102 is likely to be deformed downward in a convex shape when the vibrating plates 103a and 103b are deformed into convex shapes toward outer side portions, and the shaft fixing member 102 is likely to be deformed upward in a convex shape when the vibrating plates 103a and 103b are deformed into convex shapes toward inner side portions. Therefore, the vibrating plates 103a and 103b are deformed into convex shapes toward outer side portions and inner side portions, and hence, the position of the whole shaft fixing member 102 moves downward in both cases. However, depending on whether the vibrating plates 103a and 103b are deformed into convex shapes toward outer side portions or inner side portions, the direction of the deflection deformation of the shaft fixing member 102 becomes opposite up and down. Therefore, the displacement behavior of the shaft becomes different depending on upward and downward directions, and it becomes difficult to control the displacement amount of the shaft. Accordingly, it is difficult to control the vibration of the shaft 101, and, in particular, it is difficult to cause the engaging member 106 to stably move. In addition, when the flexion deformation of the vibrating plates 103a and 103b is used, the generative force of the driving force becomes small, and the resonant frequency becomes reduced. As a result, it is difficult to adjust to a case where a driven body is relatively heavy, and in general, it becomes difficult to control a driving pulse frequency if the driving pulse frequency is greater than the resonant frequency. Therefore, the movement speed of the driven body is also restricted that is decided on the basis of the product of a shaft displacement amount and the driving pulse frequency.

On the other hand, in the present embodiment, when, owing to the expansion and contraction of the piezoelectric element 10, the first portion 21 is deformed in a convex shape, it is possible to cause the movement direction of the first portion 21 due to the expansion and contraction of the piezoelectric element 10 and the direction of a displacement due to the convex-shaped deformation of the first portion 21 itself to coincide with each other. Accordingly, it is easy to control the vibration of the displacement member 7 and control the vibration of the shaft 6, namely, control the movement of the driven member 5.

Incidentally, for example, it may also be thought that the second and third portions are not fixed to the first or second end surface. However, in this case, when the piezoelectric element has contracted, the second and third portions occasionally move away from the first or second end surface. Therefore, in some cases, the contraction force of the piezoelectric element does not contribute to the vibration of the first portion. In that case, the displacement amount of the shaft becomes small.

On the other hand, in the present embodiment, the second and third portions 22 and 23 are fixed to the first end surface 10*a* or the second end surface 10*b*. Therefore, when the piezoelectric element 10 has contracted, the second and third portions 22 and 23 are displaced in directions of drawing near to each other, along with the first and second end surfaces 10*a* and 10*b*. Accordingly, in a direction in which the direction of the driving force of the piezoelectric element 10 is converted, it is possible to make the displacement amounts of the displacement member 7 and the shaft 6 larger. As a result, it is possible to make the displacement amount of the driven member 5 large, and it is possible to enhance an energy efficiency for driving the actuator 3.

In addition, in the present embodiment, the second side surface 10*d* is fixed to the fourth and fifth portions 24 and 25. However, when the fourth and fifth portions 24 and 25 in the conversion element 20 are not fixed to the second side surface 10*d*, not only the first portion 21 in the conversion element 20 is displaced in the z2 direction in association with, for example, the expansion of the piezoelectric element 10 in the x direction, but also the fourth and fifth portions 24 and 2 are displaced in the z1 direction, and the loss of vibration energy occurs. In the view of the related art, as a countermeasure against this, weights have been attached to the fourth and fifth portions 24 and 25 or a housing whose rigidity is high has been provided, and the fourth and fifth portions 24 and 25 have been fixed. On the other hand, in the present embodiment, when the displacement member 7 is vibrationally displaced owing to the driving force of the piezoelectric element 10, the second side surface 10*d* and the fourth and fifth portions 24 and 25 in the conversion element 20 are fixed. Therefore, the fourth and fifth portions 24 and 25 are subjected to constraints, and become regions where deformation and vibration are small. Accordingly, in the present embodiment, the loss of vibration energy due to the vibrations of the fourth and fifth portions 24 and 25 is reduced, and it is possible to focus the vibration energy on the convex portion 21*a* vibrating in a direction in which the driving force of the piezoelectric element 10 is converted. Furthermore, even if weights are added to the fourth and fifth portions 24 and 25 or a strong housing is provided with fixing thereto, it is possible to reduce the transmission of the vibration energy from the fourth and fifth portions 24 and 25 to the weights and the housing. Therefore, it is possible to reduce the loss of the vibration energy. Therefore, it is possible to make the displacement amount of the shaft 6 or the movement amount of the driven member 5 larger.

In addition, in the present embodiment, the second side surface 10*d* and the fourth and fifth portions 24 and 25 are caused to adhere to each other by the resin adhesive layer 33 having elasticity. Therefore, the vibration of the piezoelectric element 10 is not excessively constrained owing to the fixation of the second side surface 10*d* to the fourth and fifth portions 24 and 25. Accordingly, it is possible to displace the shaft 6 with a high degree of energy efficiency and move the driven member 5.

In addition, in the present embodiment, substantially the whole first portion 21 is configured to be the convex portion 21*a*. Therefore, it is possible to make the vibrational amplitude of the top portion of the convex portion 21*a* large in association with the expansion and contraction of the piezoelectric element 10. Accordingly, it is possible to make the displacement amount of the driven member 5 larger.

Hereinafter, other examples of preferred embodiments of the present invention will be described. In the following description, a member having a function in substantially common with the first embodiment will be referred to using a common symbol, and the description thereof will be omitted.

(Second Embodiment)

Figure 4:
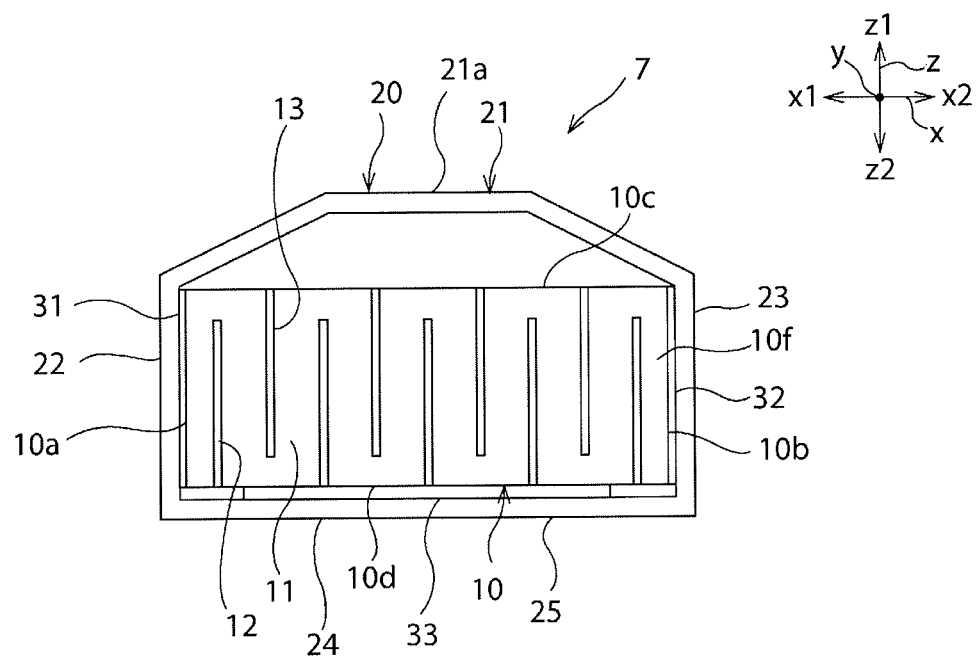
FIG. 4 is a diagrammatic side view of a displacement member in a second embodiment.

FIG. 4 is a diagrammatic side view of a displacement member in a second embodiment.

In the first embodiment, an example has been described where the second and third portions 22 and 23 are connected to the fourth portion 24 or the fifth portion 25 through the sixth portion 26 or seventh portion 27 spaced from the second side surface 10*d*. In this regard, however, the present invention is not limited to this configuration. For example, as illustrated in FIG. 4, while the sixth and seventh portions 26 and 27 may not be provided, the second and third portions 22 and 23 may also be directly connected to the fourth portion 24 or the fifth portion 25, and the whole second side surface 10*d* may also be fixed to the fourth portion 24 or the fifth portion 25 through the resin adhesive layer 33.

(Third Embodiment)

Figure 5:
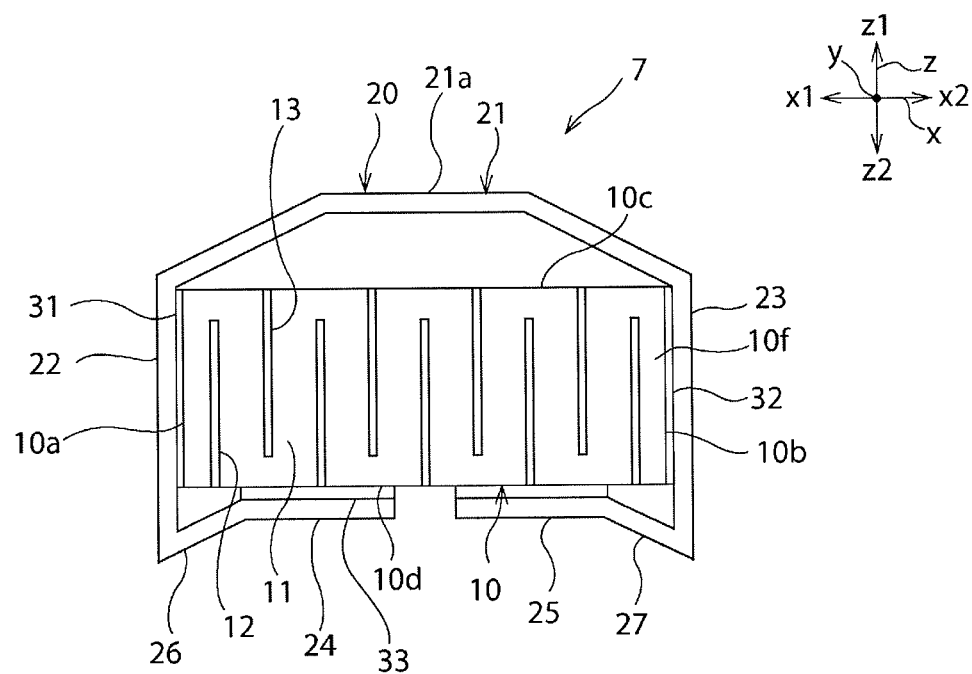
FIG. 5 is a diagrammatic side view of a displacement member in a third embodiment.

FIG. 5 is a diagrammatic side view of a displacement member in a third embodiment.

In the first embodiment, an example has been described where the fourth and fifth portions 24 and 25 are integrally formed. In this regard, however, the present invention is not limited to this configuration. For example, as illustrated in FIG. 5, the fourth portion 24 and the fifth portion 25 may also be separately provided. In this case, it is desirable that a distance between the fourth portion 24 and the fifth portion 25 is not more than 0.3 times the dimension of the second side surface 10*d* in the x direction. If the distance between the fourth portion 24 and the fifth portion 25 is set within the above-mentioned range, the resonant frequency of the displacement member 7 is increased. Therefore, it is possible to accelerate the driving speed of the piezoelectric element 10. In addition, if the displacement member 7 is caused to vibrate in the vicinity of the resonance point of this high frequency by the piezoelectric element 10, it is possible to enhance the efficiency of the displacement speed of the displacement member 7 with respect to electric power input to the piezoelectric element 10.

(Fourth to Sixth Embodiments)

Figure 6:
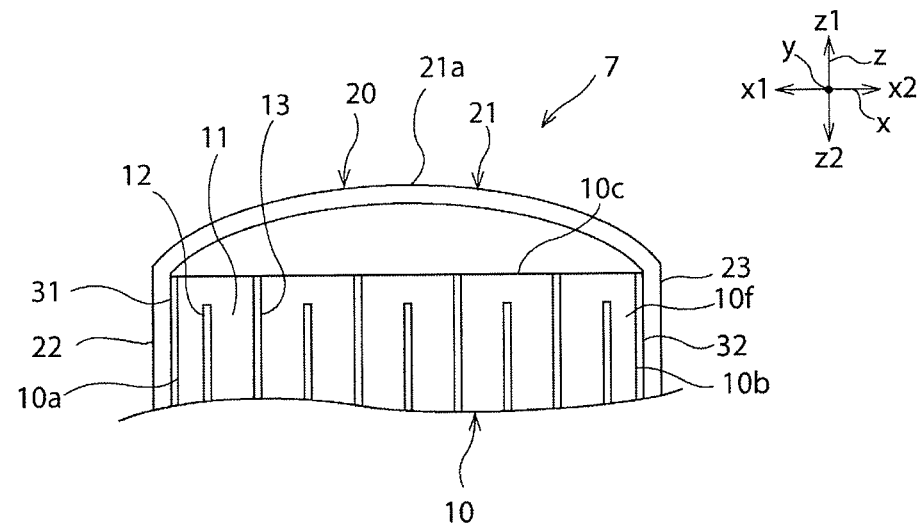
FIG. 6 is a diagrammatic side view of a displacement member in a fourth embodiment.
Figure 7:
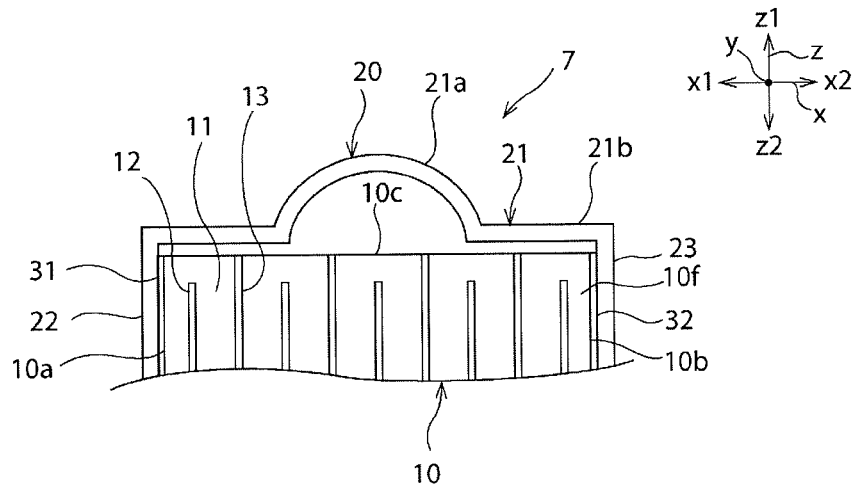
FIG. 7 is a diagrammatic side view of a displacement member in a fifth embodiment.

FIG. 6 is a diagrammatic side view of a displacement member in a fourth embodiment. FIG. 7 is a diagrammatic side view of a displacement member in a fifth embodiment.

Figure 8:
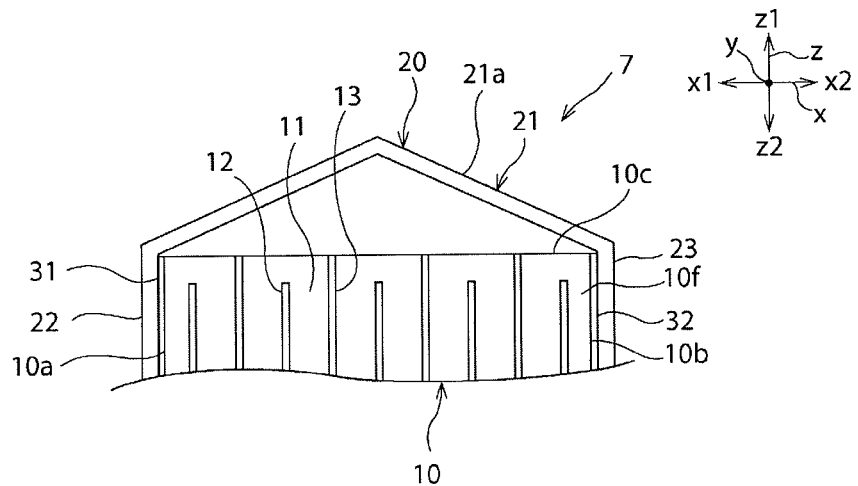
FIG. 8 is a diagrammatic side view of a displacement member in a sixth embodiment.

FIG. 8 is a diagrammatic side view of a displacement member in a sixth embodiment.

In the first embodiment, a case has been described where the first portion 21 includes three flat plate portions. In this regard, however, the present invention is not limited to this configuration. For example, as illustrated in FIG. 6, the whole first portion 21 may also be configured using a convex portion 21a having a circular-arc shape in side view.

In addition, as illustrated in FIG. 7, the first portion 21 may also be configured using a convex portion 21a, which is located in a central portion and has a circular-arc shape in side view, and a flat plate portion 21b located in a circumferential portion.

In addition, as illustrated in FIG. 8, the first portion 21 may also be configured to have two plate-like portions. In other words, it is not always necessary for the top portion of the first portion 21 to have a plane shape.

(Seventh and Eighth Embodiments)

Figure 9:
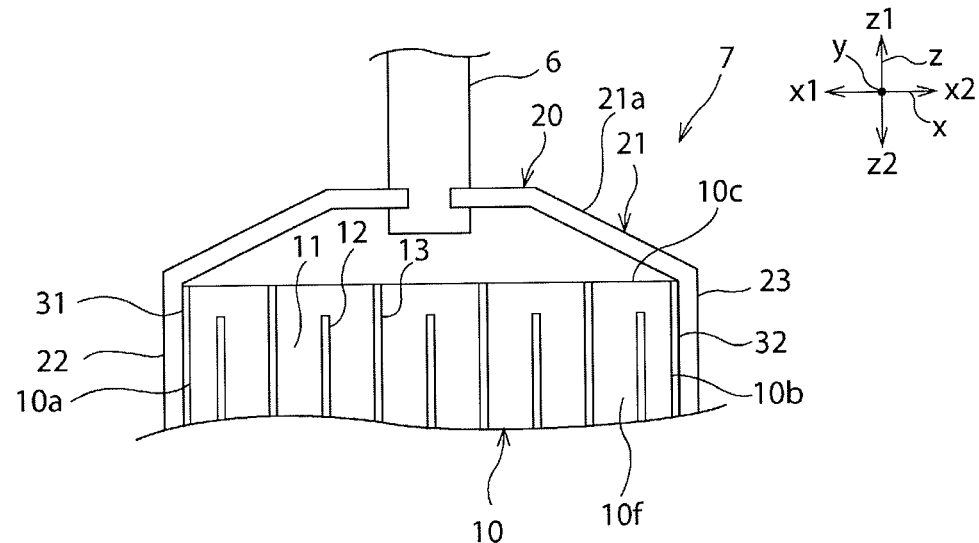
FIG. 9 is a diagrammatic side view of a displacement member in a seventh embodiment.
Figure 10:
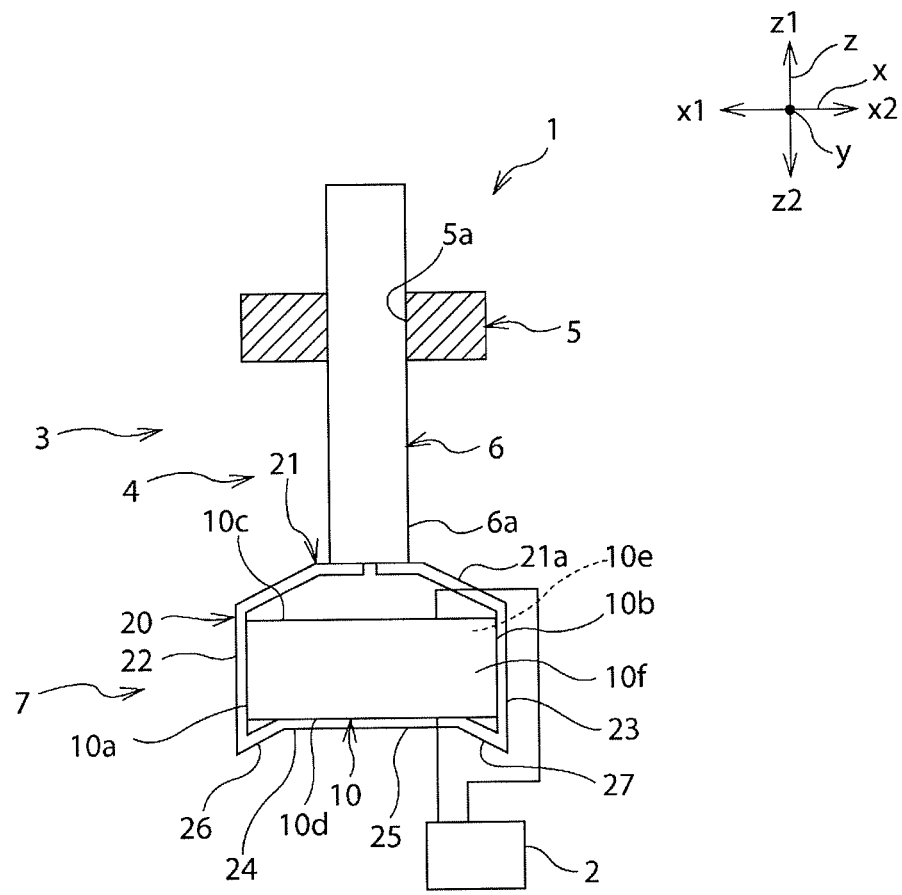
FIG. 10 is a schematic side view of a driving device according to an eighth embodiment.

FIG. 9 is a diagrammatic side view of a displacement member in a seventh embodiment. FIG. 10 is a schematic side view of a driving device according to an eighth embodiment.

As illustrated in FIG. 9 and FIG. 10, a portion of the first portion 21 may also be configured to be the shaft 6.

(Ninth and Tenth Embodiments)

Figure 11:
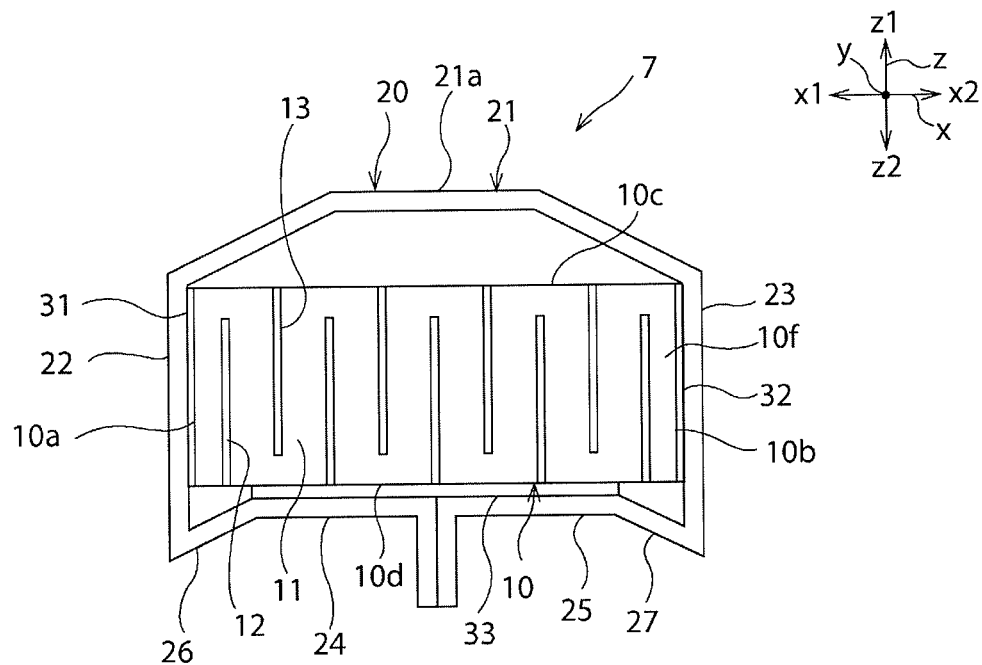
FIG. 11 is a diagrammatic side view of a displacement member in a ninth embodiment.
Figure 12:
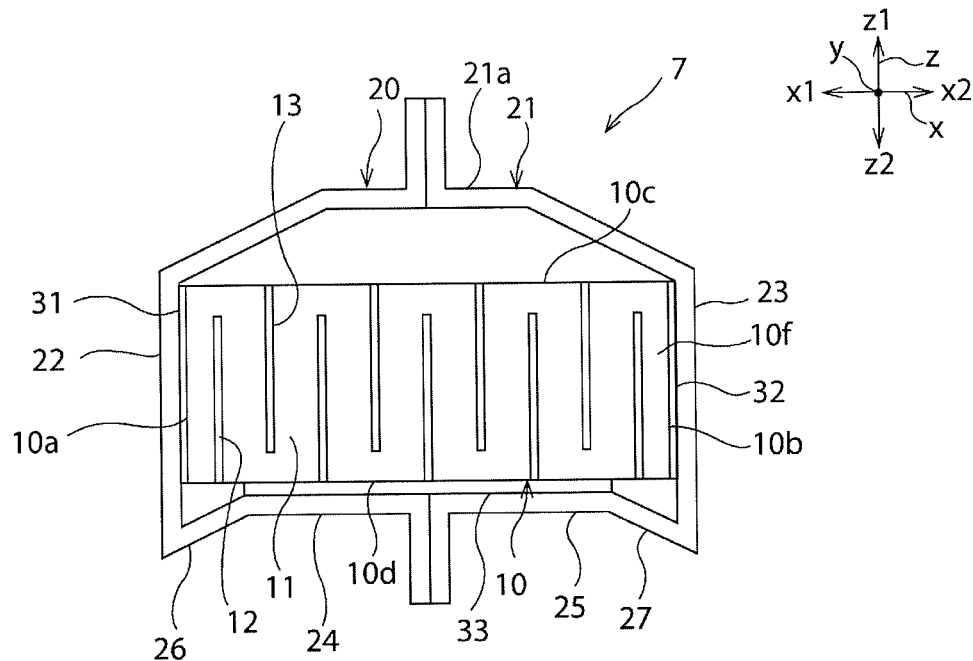
FIG. 12 is a diagrammatic side view of a displacement member in a tenth embodiment.

FIG. 11 is a diagrammatic side view of a displacement member in a ninth embodiment. FIG. 12 is a diagrammatic side view of a displacement member in a tenth embodiment.

In the first embodiment, an example has been described where the conversion element 20 is seamless. In this regard, however, the present invention is not limited to this. For example, as illustrated in FIG. 11, the conversion element 20 may also be formed by a single plate being bent, and the fourth and fifth portions 24 and 25 may also be directly fixed. In addition, as illustrated in FIG. 12, the conversion element 20 may also be formed by two plates being directly fixed.

(Eleventh Embodiment)

Figure 13:
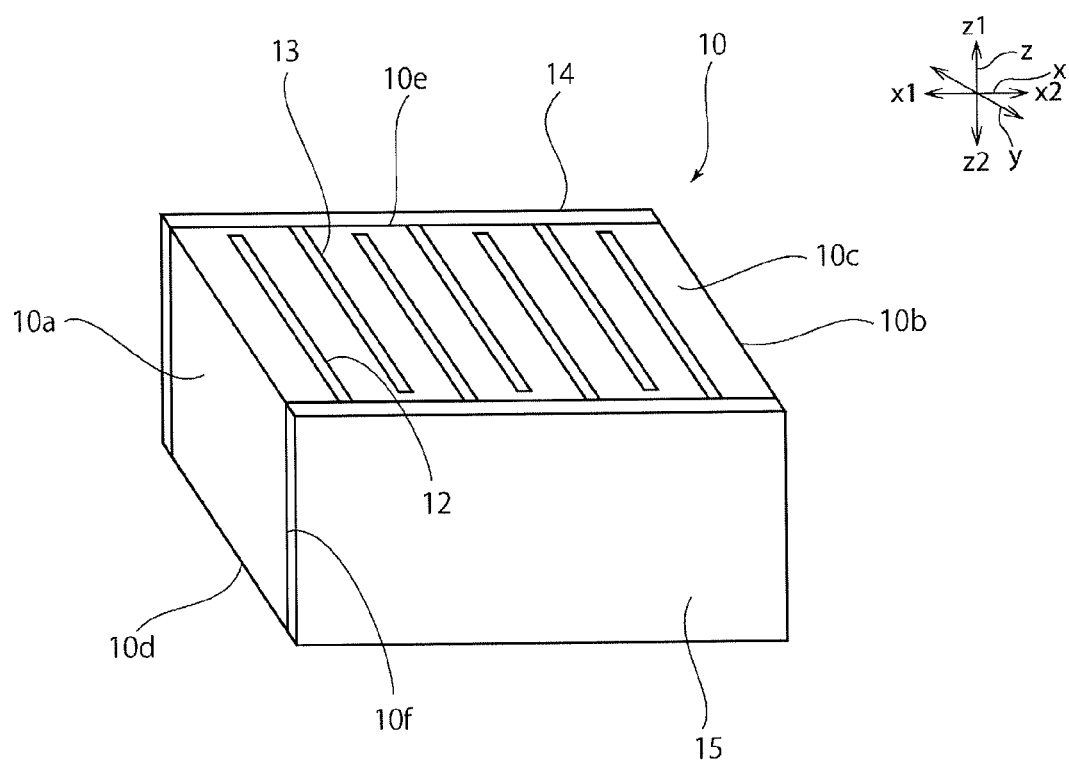
FIG. 13 is a diagrammatic perspective view of a piezoelectric element in an eleventh embodiment.

FIG. 13 is a diagrammatic perspective view of a piezoelectric element in an eleventh embodiment.

In the first embodiment, an example has been described where the first electrode 12 is extracted to the second side surface 10d and the second electrode 13 is extracted to the first side surface 10c. In this regard, however, the present invention is not limited to this configuration. For example, as illustrated in FIG. 13, the first electrode 12 may also be extracted to the fourth side surface 10f and the second electrode 13 may also be extracted to the third side surface 10e. In addition, in that case, on the fourth side surface 10f, an outer electrode 15 may also be provided to which the plural first electrodes 12 are electrically connected, and on the third side surface 10e, an outer electrode 14 may also be provided to which the plural second electrodes 13 are electrically connected.

(Another Embodiment)

In the first embodiment, an example has been described where the shaft 6 is fixed to the first portion 21. In this regard, however, the present invention is not limited to this configuration. For example, the shaft 6 may also be attached to at least one of the fourth and fifth portions 24 and 25, and the first portion 21 may also be fixed or a weight may also be attached to the first portion 21. Even in this case, since, using the conversion element 20, it is possible for the displacement amount of the piezoelectric element 10 to be made large and transmitted to the shaft 6. Therefore, it is possible to achieve the miniaturization of the piezoelectric element 10. Accordingly, it is possible to achieve the miniaturization of the displacement member 7.

REFERENCE SIGNS LIST 1 driving device
2 control unit
3 actuator
4 driving member
5 driven member
5a through hole
6 shaft
7 displacement member
10 piezoelectric element (driving element)
10a first end surface
10b second end surface
10c first side surface
10d second side surface
10e third side surface
10f fourth side surface
11 piezoelectric layer
12 first electrode
13 second electrode
14, 15 outer electrode
20 conversion element
21 first portion
21a convex portion
21b flat plate portion
22 second portion
23 third portion
24 fourth portion
25 fifth portion
26 sixth portion
27 seventh portion
31 to 33 resin adhesive layer

The invention claimed is:

1. A displacement member comprising:
 a driving element including first and second side surfaces extending in a first direction and top and bottom surfaces extending in a second direction perpendicular to the first direction, the driving element being configured to expand and contract in the second direction in response to a pulsed voltage; and
 an elastic conversion element containing the driving element and including;
  a first portion disposed above the top surface of the driving element and including a convex portion that is spaced apart from the top surface of the driving element,
  a second portion coupled to one end of the first portion and contacting the first side surface of the driving element, and
  a third portion coupled to a second end of the first portion directly and contacting the second side surface of the driving element,
 wherein the first portion of the elastic conversion element comprises a displacement portion that moves downwardly and upwardly in the first direction when the driving element expands and contracts in the second direction, respectively.

2. The displacement member according to claim 1, wherein the elastic conversion element further comprises:
 a fourth portion extending perpendicularly to the second portion and fixed to at least a first portion of the bottom surface of the driving element, and a fifth portion extending perpendicularly to the third portion and fixed to at least a second portion of the bottom surface of the driving element.

3. The displacement member according to claim 2, wherein the fourth portion is directly coupled to the fifth portion and substantially all of the bottom surface of the driving element is fixed to the fourth and fifth portions.

4. The displacement member according to claim 3, wherein the fourth portion and the fifth portion of the elastic conversion element are integrally formed.

5. The displacement member according to claim 2, further comprising a resin adhesive layer configured to fix the fourth and fifth portions of the elastic conversion element to the first and second portions of the bottom surface of the driving element, respectively.

6. The displacement member according to claim 2, wherein the second portion is fixed to the first side surface of the driving element and the third portion is fixed to the second side surface of the driving element.

7. The displacement member according to claim 2, wherein the conversion element further comprises:
a sixth portion that couples the second portion to the fourth portion and is disposed above an end edge portion of the bottom surface adjacent the first side surface,
a seventh portion that couples the third portion to the fifth portion and is disposed above an end edge portion of the bottom surface adjacent the second side surface, and
wherein each of the sixth and seventh portions is spaced apart from the bottom surface of the driving element.

8. The displacement member according to claim 1, wherein the driving element is fitted into the elastic conversion element.

9. The displacement member according to claim 1, wherein the conversion element comprises a metal.

10. The displacement member according to claim 1, wherein the driving element comprises a piezoelectric element having a plurality of first and second electrodes.

11. The displacement member according to claim 2,
wherein the displacement portion of the first portion of the elastic conversion element extends in the second direction, and
wherein the first portion of the elastic conversion element further comprises first and second planar side surfaces that extend from opposite ends of the displacement portion to the second and third portions of the elastic conversion element, respectively.

12. The displacement member according to claim 11, wherein the first and second planar side surfaces each extend from the displacement portion at an angle between 15 degrees and 45 degrees.

13. The displacement member according to claim 11,
wherein the top and bottom surfaces of the driving element are disposed a first distance L1 from each other,
wherein the first and second side surfaces of the driving element are disposed a second distance L2 from each other, and
wherein the ratio of L2 to L1 is between 0.8 and 2.0.

14. The displacement member according to claim 13,
wherein the displacement portion of the first portion of the elastic conversion element extends a third distance L3, and
wherein the ratio of L3 to L2 is between 0.3 and 0.7.

15. An actuator comprising:
a displacement member including:
a driving element including first and second side surfaces extending in a first direction and top and bottom surfaces extending in a second direction perpendicular to the first direction, the driving element being configured to expand and contract in the second direction in response to a pulsed voltage; and
an elastic conversion element containing the driving element and including:
a first portion disposed above the top surface of the driving element,
a second portion coupled to one end of the first portion and contacting the first side surface of the driving element, and
a third portion coupled to a second end of the first portion and contacting the second side surface of the driving element,
wherein the first portion of the elastic conversion element comprises a displacement portion that move downwardly and upwardly in the first direction when the driving element expands and contracts in the second direction, respectively; and
a displaced member attached to the displacement member.

16. The actuator according to claim 15, wherein the elastic conversion element further comprises:
a fourth portion extending perpendicularly to the second portion and fixed to at least a first portion of the bottom surface of the driving element, and
a fifth portion extending perpendicularly to the third portion and fixed to at least a second portion of the bottom surface of the driving element, and
wherein the displaced member is attached to at least one of the first portion, the fourth portion and the fifth portion of the elastic conversion element.

17. The actuator according to claim 15, wherein the displaced member is attached to the displacement portion.

18. The actuator according to claim 15,
wherein the displaced member is a shaft, and
wherein the actuator further comprises a driven member coupled to the shaft that is configured to move in the first direction based on a frictional force with the shaft when the shaft is displaced in the first direction.

19. A driving device comprising:
the actuator according to claim 15; and
a control unit configured to control the actuator.

* * * * *